(12) United States Patent
Shooshtarian et al.

(10) Patent No.: US 7,037,797 B1
(45) Date of Patent: May 2, 2006

(54) LOCALIZED HEATING AND COOLING OF SUBSTRATES

(75) Inventors: Sohaila Shooshtarian, Palo Alto, CA (US); Narasimha Acharya, Sunnyvale, CA (US); Mike Elbert, San Jose, CA (US); Andreas Tillmann, Tomerdingen (DE); Dieter Zernickel, Amstetten (DE)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/527,873

(22) Filed: Mar. 17, 2000

(51) Int. Cl.
*H01L 21/336* (2006.01)

(52) U.S. Cl. .................. 438/308; 438/378; 438/795

(58) Field of Classification Search .......... 438/308, 438/378, 795; 219/443, 450, 409, 411, 413
See application file for complete search history.

(56) References Cited

U.S. PATENT DOCUMENTS

| | | | |
|---|---|---|---|
| 3,862,397 A | 1/1975 | Anderson et al. .......... 219/405 |
| 4,836,138 A | 6/1989 | Robinson et al. .......... 118/666 |
| 4,863,547 A | 9/1989 | Shidahara et al. |
| 4,914,276 A | 4/1990 | Blair .......................... 219/390 |
| 4,924,073 A | * 5/1990 | Chiba ......................... 219/413 |
| 5,002,010 A | 3/1991 | Weinberg |
| 5,108,792 A | 4/1992 | Anderson et al. .......... 427/248 |
| 5,113,929 A | 5/1992 | Nakagawa et al. .......... 165/61 |
| 5,129,360 A | 7/1992 | Ahern et al. ................ 118/724 |
| 5,160,545 A | 11/1992 | Maloney et al. ............ 118/725 |
| 5,177,878 A | 1/1993 | Visser |
| 5,199,483 A | 4/1993 | Bahng |
| 5,228,501 A | 7/1993 | Tepman et al. |
| 5,252,366 A | 10/1993 | Ahern et al. ................ 427/557 |
| 5,414,244 A | 5/1995 | Imahashi .................... 219/497 |
| 5,431,700 A | 7/1995 | Sloan |
| 5,436,172 A | * 7/1995 | Moslehi et al. ............. 374/121 |
| 5,449,883 A | 9/1995 | Tsuruta ....................... 219/483 |
| 5,478,401 A | 12/1995 | Tsunekawa et al. |
| 5,609,689 A | 3/1997 | Kato et al. |
| 5,673,750 A | 10/1997 | Tsubone et al. |
| 5,778,968 A | 7/1998 | Hendrickson et al. |

(Continued)

FOREIGN PATENT DOCUMENTS

| | | |
|---|---|---|
| EP | 451740 A2 | 10/1991 |
| EP | 454054 A2 | 10/1991 |
| EP | 695922 A1 | 2/1996 |
| JP | 59275987 | 7/1986 |
| JP | 02301173 | 6/1992 |

OTHER PUBLICATIONS

English Abstract of Japanese Patent JP 63 124528, Mar. 28, 1988.
English Abstract of Japanese Patent JP 04 266015, Sep. 22, 1992.
PCT Int'l Search Report for Appl. No. PCT/IB01/00392, Sep. 21, 2001.
PCT Search Report for Appl. No. PCT/IB99/01832; Mar. 28, 2000.

*Primary Examiner*—Hsien-Ming Lee
(74) *Attorney, Agent, or Firm*—Dority & Manning, P.A.

(57) ABSTRACT

The present invention is directed to an apparatus and process for locally heating and/or cooling of semiconductor wafers in thermal processing chambers. In particular, the apparatus of the present invention includes a device for heating or cooling localized regions of a wafer to control the temperature of such regions during one or more stages of a heat cycle. In one embodiment, gas nozzles eject gas towards the bottom of the wafer to provide localized temperature control. In another embodiment, a transparent gas pipe containing a variety of gas outlets distributes gas onto the top surface of the wafer to provide localized temperature control.

33 Claims, 6 Drawing Sheets

U.S. PATENT DOCUMENTS

| | | |
|---|---|---|
| 5,814,365 A | 9/1998 | Mahawili |
| 5,846,375 A | 12/1998 | Gilchrist et al. |
| 5,881,208 A * | 3/1999 | Geyling et al. ............. 392/418 |
| 5,926,742 A * | 7/1999 | Thakur et al. .............. 438/795 |
| 5,997,175 A * | 12/1999 | Champetier et al. ........ 374/126 |
| 6,018,616 A | 1/2000 | Schaper ..................... 392/418 |
| 6,100,506 A * | 8/2000 | Colelli et al. ............ 219/446.1 |
| 6,105,274 A | 8/2000 | Ballantine et al. |
| 6,203,620 B1 * | 3/2001 | Moslehi ....................... 118/723 |
| 6,209,480 B1 * | 4/2001 | Moslehi ....................... 118/723 |
| 6,239,038 B1 * | 5/2001 | Wen ........................... 438/745 |

\* cited by examiner

LOCALIZED HEATING AND COOLING OF SUBSTRATES

FIELD OF THE INVENTION

The present invention is generally directed to a method and apparatus heat for treating a substrate, such as a semiconductor wafer.

BACKGROUND OF THE INVENTION

A thermal processing chamber as used herein refers to a device that rapidly heats objects, such as semiconductor wafers. Such devices typically include a substrate holder for holding a semiconductor wafer and a thermal energy source, such as a light source that emits energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

Many semiconductor heating processes require a wafer to be heated to high temperatures so that various chemical and physical reactions can take place as the wafer is fabricated into a device. During rapid thermal processing, which is one type of processing, semiconductor wafers are typically heated by arrays of light sources to temperatures, for instance, from about 400° C. to about 1,200° C., for times which are typically less than a few minutes.

For instance, in the past, semiconductor wafers were heated according to a predetermined heating cycle. For example, the wafers were typically heated from an initial temperature to a desired temperature at a very fast heating rate. The wafers were then maintained at the desired temperature for a time sufficient for desired processes to take place. For instance, during these heating cycles the wafers can be annealed or various coatings and films can be deposited onto the wafers, such as oxide films. In order to complete the heating cycle, the light sources are switched off and the wafers were allowed to cool after being maintained at a desired, temperature for a predetermined amount of time. In general, the wafers were allowed to cool by simply removing or turning off the heating source. Moreover, in some cases, a cooling device was also used to cool the wafer.

Recently, emphasis has been placed upon forming integrated circuits having thinner and more uniform layers that are more efficient and require less power to operate. In this regard, recent focus has turned to not only more precisely forming coatings and films in thermal processing chambers, but also on reducing the length of time it takes to complete a heating cycle in the chamber, e.g., temperature ramp-up, a steady state temperature, and cooling. In general, to accomplish the desired results, the wafers must generally be heated and cooled as uniformly as possible.

However, one problem with heating and cooling semiconductor wafers is that the temperature profile of a wafer can vary at different wafer locations, thereby decreasing overall heating and cooling uniformity. For example, when forming an oxide layer on a silicon wafer using conventional processing systems, the temperature profile of the wafer typically has deviations from the desired uniform temperature that are due to a variety of factors, such as the type of heaters utilized, geometry of the chamber, etc. These deviations are typically localized in only certain regions of the wafer. For instance, localized temperature deviations can be prevalent during the ramp-down and ramp-up stages of the heat cycle. During such stages, the localized outer regions of the wafer tend to heat or cool faster than the localized center region. This leads to non-uniformities in temperature profile across the wafer.

Such localized temperature deviations typically have a magnitude on the order of a few degrees and are localized in regions of centimeters on the wafer. In particular, in rapid thermal processes, the deviations are usually in the range from about 0.1% to about 10% from the target uniform temperature. For example, a typical localized deviation in a conventional rapid thermal processing system is about 5° C. for a target process temperature of about 1,000° C.

As such, a need currently exists for an improved apparatus and process for cooling and heating wafers in rapid thermal processing chambers. In particular, a need currently exists for a rapid thermal processing chamber that is capable of locally cooling and/or heating a semiconductor to minimize deviations in the temperature profile of the wafer.

SUMMARY OF THE INVENTION

The present invention recognizes and addresses the foregoing disadvantages and others of prior art constructions and methods.

Accordingly, it is an object of the present invention to provide a method and apparatus for heat treating objects, such as semiconductor wafers.

Another object of the present invention is to provide an apparatus and method for heat treating a semiconductor wafer that is capable of heating and cooling localized regions of the wafer during a predetermined heat cycle.

Still another object of the present invention is to provide an apparatus and method for controlling the temperature of localized regions of a semiconductor wafer during a predetermined heat cycle.

These and other objects of, the present invention are achieved by providing an apparatus for heat treating semiconductor wafers during the process of producing integrated circuits. The apparatus can be used for various operations such as for annealing wafers after an ion implantation step, or for constructing or annealing coatings and films on semiconductor wafers, such as those made from conductive materials, insulators, and semiconductive materials. The apparatus includes a thermal processing chamber adapted to contain semiconductor wafers. A substrate holder can be contained within the thermal processing chamber for holding and rotating the wafers. For heating the wafers, a heat source can be placed in communication with the thermal processing chamber. The heat source can be, for instance, a plurality of lamps which emit thermal radiation.

In accordance with the present invention, the apparatus further includes a device for heating and/or cooling localized regions of a semiconductor wafer. By locally heating and/or cooling certain regions of a wafer, deviations in temperature can be corrected or substantially inhibited. In particular, it is normally desired to heat a wafer to a predetermined temperature during a certain stage of a heat cycle. To achieve adequate process results (e.g., uniform oxide thickness), the entire wafer must generally be maintained at this predetermined temperature. As such, according to the present invention, these deviations in the predetermined temperature can be adequately corrected so that a substantially uniform temperature profile results for the wafer.

For example, in one embodiment of the present invention, the device for localized heating and/or cooling can be positioned below the wafer. In this embodiment, the device can be equipped with one or more gas outlets that can supply one or more gases to the wafer. During processing, these gases can be supplied to heat or cool the wafer. For instance, when heating the wafer during the ramp-up stage, various localized regions (e.g., outer regions) of the wafer can be cooled by these gases to compensate for "over-heating", which would otherwise inhibit uniform heating.

Moreover, a variety of control mechanisms can also be utilized to control the application of a gas to the wafer. For instance, examples of such control mechanisms include, but are not limited to, controlling the flow rates of the gases, controlling the temperature of the gases, varying the types of gases, using two or more different gases, adjusting the spread profile of the gas, varying the angles at which the gases are ejected, manipulating the positioning of the outlets, varying the diameter of the gas outlets, changing the distance between gas outlets, rotating the wafer in a certain direction, mounting the gas outlets through a reflective device, etc. Moreover, these and other control mechanisms can be automatically adjusted utilizing a system controller which communicates with one or more temperature sensing devices.

In addition, another embodiment of the present invention utilizes a gas pipe for localized heating and/or cooling. Although not required, the gas pipe is typically positioned above the wafer. To ensure that heating is not inhibited by the lamp, the gas pipe is generally made from a transparent material, such as sapphire or quartz. Further, similar to the embodiment discussed above, the device of this embodiment can also be equipped with one or more gas outlets that can supply one or more gases to heat or cool localized regions of the wafer.

Further, any of the control mechanisms mentioned above can be used in conjunction with the gas pipe. However, other mechanisms can also be utilized in accordance with this embodiment. For instance, examples of such control mechanisms include, but are not limited to, varying the diameter and/or length of the gas pipe, separating the gas pipe into different segments, using multiple gas pipes (e.g., inner pipe), using multiple lines or chains of gas outlets with a single gas pipe, etc. Further, similar to the embodiment discussed above, these and other control mechanisms can be automatically adjusted utilizing a system controller which communicates with one or more temperature sensing devices Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for locally cooling and/or heating wafers in a thermal processing chamber. For heating semiconductor wafers, the thermal processing chamber can contain conventional heating sources, such as a plurality of lamps that emit radiant energy. Moreover, the thermal processing chamber can also contain a cooling device for actively cooling the entire semiconductor wafer after it has been heated.

In accordance with the present invention, the heating sources and/or cooling devices can also be used in conjunction with a device for correcting temperature deviations along one or more "localized regions" of the wafer. For example, the device can typically provide hot and/or cold gases to selected localized regions of a semiconductor wafer to correct "temperature deviations".

As used herein, a "localized region(s)" generally refers to a discrete area defined along one or more axes of a substrate. For example, a disc-shaped wafer has localized regions defined along its radial axes. Typically, this discrete area is less than about 50% of the total area of a cross-section of the substrate, particularly less than 35% of the total area, more particularly less than 25% of the total area, and most particularly less than about 15% of the total area.

As used herein, "temperature deviation(s)" generally refers to the absolute difference between a predetermined temperature, as defined by the heat cycle, and the actual temperature of a certain localized region during a stage of the heat cycle. In general, temperature deviations of the present invention are less than about 100° C., particularly less than about 50° C., more particularly less than 25° C., and most particularly, less than about 5° C. However, localized heating and/or cooling is not usually required for temperature deviations less than about 3° C., and more particularly, less than about 1° C.

In general, a device of the present invention used for localized heating and/or cooling can take on various forms and can function in different manners. For instance, in one embodiment, the device can include gas jets for providing hot and/or cold gases to localized regions of the wafer. Moreover, in another embodiment, the device can include a gas pipe containing nozzles that distribute hot and/or cold gases to localized regions of the wafer.

Various advantages and benefits are achieved through the apparatus and process of the present invention. For instance, through the use of a device of the present invention, the temperature profile of the semiconductor wafer can be maintained at a substantially uniform temperature throughout the entire heating cycle, which includes ramp-up, steady-state, and ramp-down stages. By maintaining the temperature profile of the wafer at substantially uniform temperatures, the resulting thermal processing chambers are particularly well adapted to cause effective annealing of damage and activation of ion implanted impurities in the silicon, to form ultrathin coatings and films on semiconductor wafers, and to anneal thin films, conductive or insulating, which were previously deposited on semiconductor wafers. The thermal processing chamber of the present invention is also capable of forming highly uniform coatings and films with improved electrical properties.

Figure 1:
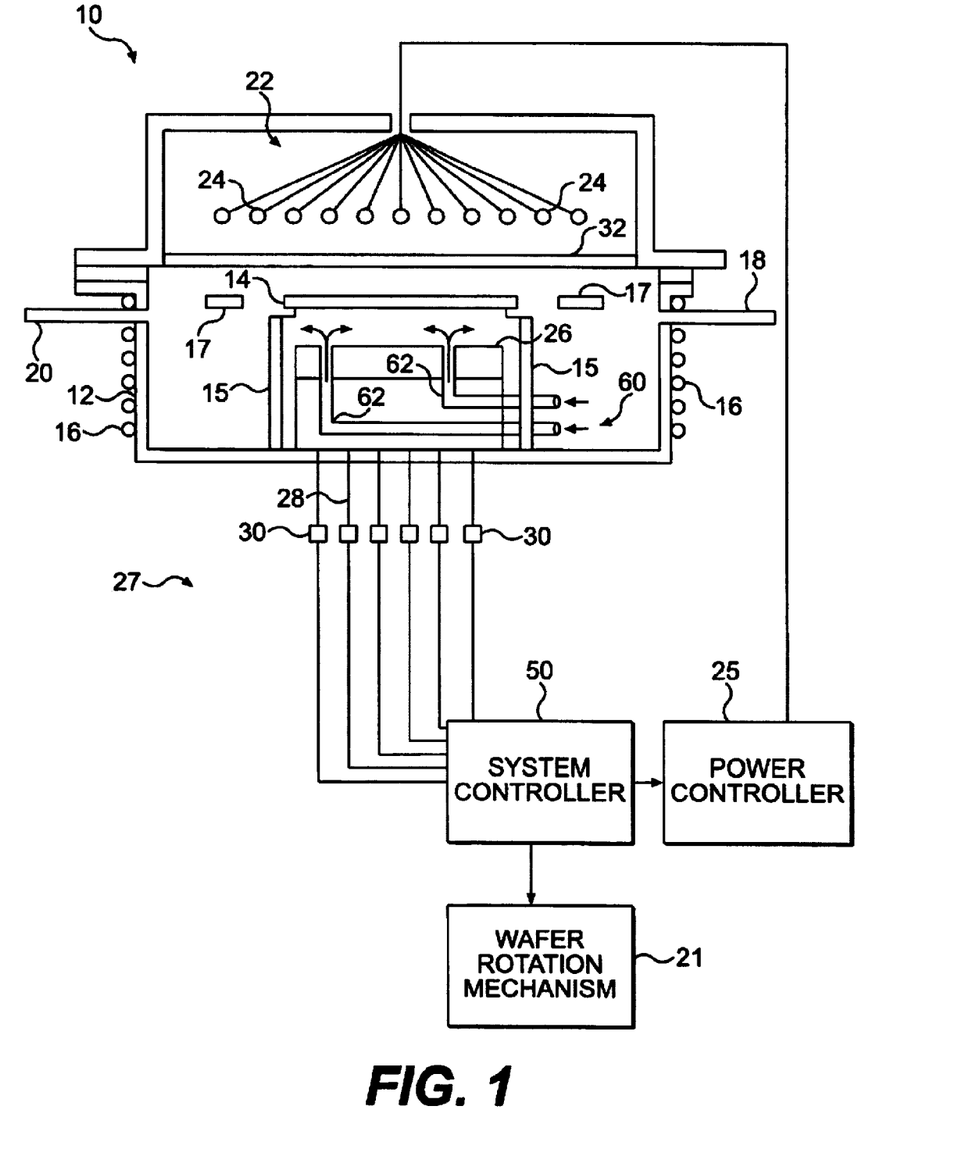
FIG. 1 is a cross-sectional view of one embodiment of an apparatus for heat treating semiconductor wafers in accordance with the present invention.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including, for example, metals and/or transparent materials. For instance, in one embodiment, all or a portion of chamber 12 can be made from stainless steel, brass or aluminum. Moreover, in another embodiment, all or a portion (e.g., walls) of chamber 12 can be made from a transparent material, such as quartz or sapphire. Such a transparent material can be particularly useful when heating wafer 14 from more than one side with thermal radiation generated by heating lamps (e.g., halogen lamps).

In some embodiments, the chamber 12 can also include a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a relatively low temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14 in order to form, for example, oxide coatings, conductive layers, etc. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. For example, lamps 24 can be placed below wafer 14, on the sides of wafer 14, and combinations thereof. Accordingly, additional lamps could be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the radiant energy being emitted by any of the lamps.

In order to monitor the temperature of wafer 14 during the heating cycle, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be Used to control the necessary amount of heating and/or cooling applied to the wafer.

During the process of the present invention, system 10 should be designed such that optical fibers 28 only detect thermal radiation being emitted by wafer 14 and not detect radiation being emitted by lamps 24. In this regard, system 10 includes a filter 32 which prevents thermal radiation being emitted by lamps 24 at the wavelength at which light detectors 30 operate from entering chamber 12. Filter 32 also serves to isolate lamps 24 from wafer 14 and prevent contamination of the chamber. Filter 32 as shown in FIG. 1 can be a window positioned between chamber 12 and heat source 22 and can be made from, for instance, fused silica or quartz. In an alternative embodiment, each lamp 24 can be covered by a separate filter.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed-adjacent the wafer from which the temperature can be extrapolated.

In addition, a reflective device 26 is also contained within chamber 12, adjacent to wafer 14. Reflective device 26 is connected to light pipes 28 which are, as described above, in communication with a plurality of corresponding light detectors 30. Moreover, light pipes 28, pyrometers, and/or thermocouples can also be fed through the reflective device 26 to detect radiation in the spaces between wafer 14 and reflective device 26, or to detect the temperature of wafer 14.

In general, reflective device 26 is designed to reflect the thermal radiation being emitted by wafer 14 at the wavelength at which light detectors 30 operate. Reflective device 26 causes the radiation being emitted by wafer 14 to reflect multiple times between a surface of wafer 14 and a surface of reflective device 26.

Reflective device 26 should generally be placed as close as possible to wafer 14 in order to increase the amount that the thermal radiation being emitted by the wafer is reflected. Since reflective device 26 is typically at a lower temperature than wafer 14, however, placing, the reflective device too close to the wafer may interfere with the heating process or may prevent the wafer from being heated at a uniform rate. The choice of the distance or spacing between wafer 14 and reflective device 26 depends upon the size of wafer 14. For wafers measuring 200 mm in diameter, in general reflective device 26 can be spaced from about 3 mm to about 15 mm from wafer 14. More particularly, for this wafer size, reflective device 26 is typically spaced from wafer 14 a distance of from about 6 mm to about 8 mm. A larger degree of spacing may be preferable for larger wafers.

Reflective device 26 should have a very high reflectivity, preferably greater than 0.9 at the wavelength at which radiation is sampled by optical fibers 28 and light detectors 30. Reflective device 26 can be made from various materials. In one preferred embodiment, a reflective surface is formed by coating a metallic substrate, such as stainless steel, with a dielectric film. The dielectric film can be a multi-layer optical film specially designed to have the appropriate reflectivity at the desired wavelength. Such films are known in the art and can be obtained from Deposition Sciences, Inc. of Santa Rosa, Calif.

Besides dielectric films, the reflective surface can also be made from highly polished metals coated with a clear protective coating, such as a clear dielectric coating. Such metals include gold, silver, and nickel. However, for a particular desired wavelength, metal surfaces are typically not as reflective as the dielectric films described above. Also, the metals may cause contamination within processing chamber 12 when heated to high temperatures. The use of a reflective plate is more particularly described in U.S. Pat. No. 5,874,711, which is incorporated herein by reference.

A slip-free ring (or guard ring) 17 can also be utilized in the present invention. Slip-free ring 17, which is usually made from silicon, silicon carbide, or other similar materials, is generally designed to surround the wafer 14 so that the wafer 14 is positioned within the inside diameter of the ring 17. During operation of the thermal processing chamber, the ring 17 absorbs energy being emitted by the heater lamps 24 and then radiates the energy back to the edges of the wafer 14. The ring 17 can also reflect thermal radiation being emitted by the edge of the wafer 14 back onto the wafer. In this manner, the passively heated ring can compensate for some heat loss at the edge of the wafer 14 and also reduce convective cooling of the wafer when process gases are flowing through the chamber System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

Figure 2:
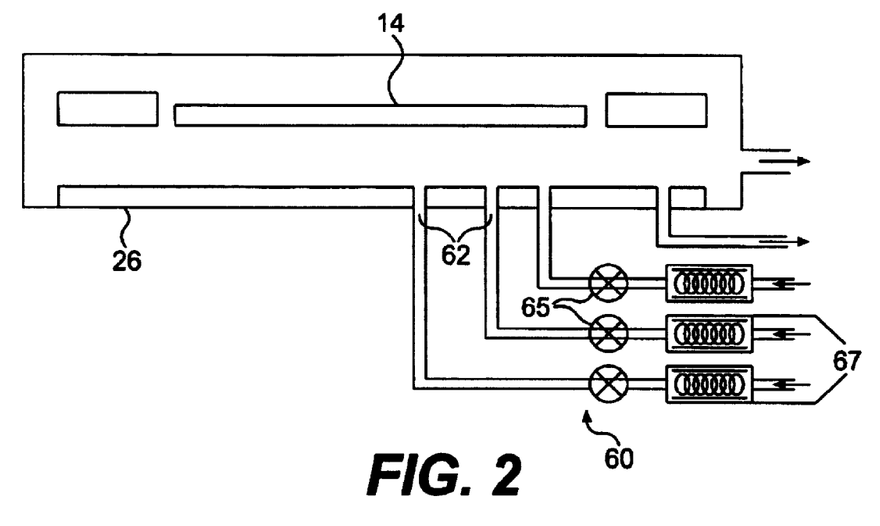
FIG. 2 is a cross-sectional view of one embodiment of a device used for localized cooling or heating in accordance with the present invention.

In accordance with the present invention, a system of the present invention also generally includes a device for locally heating and/or cooling the substrate when the wafer is being heated or cooled. Thus, in addition to controlling the output of the heating lamps, the device for locally heating and/or cooling the substrate can also be used to enhance temperature uniformity. For instance, in one embodiment, as illustrated in FIG. 1, thermal processing chamber 12 can include a device generally 60 for locally cooling and/or heating certain regions of wafer 14. In particular, as shown in FIGS. 1–2, at least one gas outlet (e.g., jet or nozzle) 62 is positioned below wafer 14 and extends through reflective device 26 such that gas is applied to discrete sections, or localized regions, of semiconductor wafer 14. However, it should also be understood that a gas outlet 62 need not extend through reflective device 26. In fact, the outlet 62 can be configured in any desired manner to supply a gas to a localized region of the bottom surface of wafer 14. Moreover, the gas outlet 62 can also be configured to supply gas to the sides or top surface of wafer 14.

By providing gas in the manner indicated above, the temperature of one or more localized regions of wafer 14 can be controlled. For example, in one embodiment, a cold gas can be supplied by gas outlets 62 to reduce the temperature of a localized region of the semiconductor wafer 14. In another embodiment, a hot gas can be supplied by outlets 62. Moreover, in some embodiments, both hot and cold gases can be simultaneously applied by different outlets. In general, any type of gas normally used to cool or heat a substrate can be used in the present invention. Examples of some gases that can be used in the present invention include inert gases, e.g, nitrogen, argon, and the like; gases with high thermal conductivity, e.g, helium, hydrogen, oxygen, mixtures thereof, and the like; etc.

To provide control over the temperature of localized regions of a wafer during a heating cycle, a variety of parameters can generally be controlled. For example, in one embodiment, the number of gas outlets 62 can be increased to provide localized heating and/or cooling to more than one discrete region of wafer 14. As a result, the gas outlets 62 provide better control over the temperature of a variety of localized regions of a semiconductor wafer, thereby allowing for better overall temperature uniformity.

Moreover, in some embodiments, the positioning of outlets 62 can also be controlled to allow for controlled localized heating and/or cooling. For instance, in one embodiment, it may be required to provide more cooling or heating to the localized edge regions of the wafer.

Figure 3:
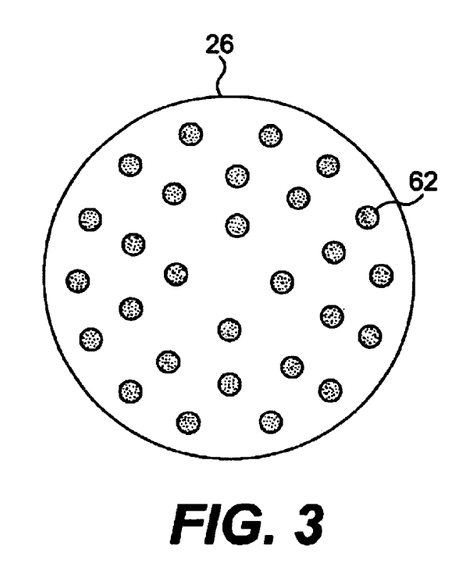
FIG. 3 is a cross-sectional view of the device illustrated in FIG. 2.

Accordingly, the gas outlets can be positioned radially to correspond to the outer edges of the wafer. For example, in one embodiment, as shown in FIG. 3, the outlets 62 can be positioned through reflective device 26 so that the number of outlets increases outwardly from the wafer center. Moreover, in another embodiment, a gas outlet (not pictured) can also be positioned substantially below the wafer center.

In addition, wafer rotation can also be utilized to control the localized heating and/or cooling of the wafer. For example, when a wafer is rotated, the gases flowing through the outlets and into the chamber have a tendency to flow in an outwardly radial direction. Thus, because the gas flow impinges on the bottom surface of the wafer and spreads radially, the convective cooling or heating effect on the wafer will be maximum at the radial locations of the wafer. On the other hand, when the wafer remains stationary, the convective cooling or heating effect on the wafer will be maximum at the radial annulus of the wafer located above or below the gas outlet.

In some instances, the gas flow rate of individual gas outlets can also be controlled in accordance with the present invention. By controlling gas flow rates, a system of the present invention can provide enhanced control over each localized region of a wafer. For instance, as shown in FIG. 2, valves 65 can be utilized to independently control gas flowing from outlets 62. It should be understood, however, that any gas flow control device known in the art can be utilized in accordance with the present invention. In addition to controlling gas flow rate, the temperature of each gas flowing through the outlets can also be controlled. For instance, as shown in FIG. 2., heating devices 67 can be used to heat the gases to a predetermined temperature. It should also be understood that a cooling device can similarly be utilized to cool the gases to a predetermined temperature. Furthermore, different gases can also be supplied to some or all of the gas outlets 62 to provide enhance control over the temperature of the localized regions of the wafer.

In addition, the mere presence of gas outlets on the reflective device can also enhance the control over the temperature of localized regions of a wafer. For example, the presence of the gas outlets 62 on reflective device 26 generally reduces the reflectivity of device 26 at those locations where the outlets extend through the device. By reducing reflectivity, the gas outlets 62 can thereby reduce the temperature of localized regions of wafer 14 that correspond to the regions of reflective device occupied by the outlets 62. Thus, in addition to supplying gases to the localized regions, the gas outlets 62 can also enhance control over the temperature of the localized regions by reducing the energy reflected to those regions. This reduction in reflectivity can be particularly useful when cooling the wafer during the heating cycle, as described above.

Moreover, to further enhance the control over the temperature of the localized regions of the wafer, the ejection angle of each outlet relative to the object wafer can also be adjusted. For example, by positioning a nozzle at a 90° angle with respect to the wafer, gas will be supplied to a localized region defined directly above the nozzle. However, by positioning a nozzle at a 45° angle, for example, gas can be directed away from the nozzle, closer to the edges of the wafer.

Besides the embodiments described above, localized cooling and/or heating can also be accomplished in a variety of other ways. For example, in another embodiment of the present invention, as illustrated in FIGS. 5–9, a thermal processing chamber 12, as described in detail above, can also include at least one gas pipe 70 positioned between lamps 24 and wafer 14. A gas flowing through such a pipe and exiting through the gas outlets can stream over localized regions of the wafer and, thereby uniformly heat or cool the wafer. However, it should also be understood that the gas pipe 70 can also be positioned below the wafer as an alternative, or in addition to, positioning the pipe above the wafer.

In general, a gas pipe of the present invention can be constructed from a variety of materials. For example, in most embodiments, the pipe 70 is made from a transparent material, such as quartz or sapphire, to minimize the influence of the gas pipe on wafer heating. In most embodiments, the gas pipe is also utilized in conjunction with a rotation mechanism 21 (described above) that can be adapted to rotate wafer 14. Rotating the wafer can allow the gas pipe to not only heat and/or cool localized regions of wafer 14, but also to aid in cooling the entire wafer during ramp-down, such as in the embodiment illustrated in FIGS. 1–4 discussed above.

Moreover, the gas pipe can also be constructed to have any of a variety of sizes and/or shapes. For instance, any diameter (cross section) of the gas pipe 70 can generally be used. However, in most embodiments, the diameter of gas pipe 70 does not exceed the diameter of the lamps, particular when linear lamps are utilized. Specifically, the gas pipe 70 typically has a diameter less than, or equal to, the distance between two adjacent lamps 24 so that the pipe 70 can be positioned in the gap parallel to the lamps 24.

In addition, the pipe 70 can also generally have any desired length. In most embodiments, the pipe 70 at least has a length large enough so that one end of the pipe substantially aligns with the center of wafer 14. However, in some embodiments, the pipe 70 need not be continuous in length. For example, in one embodiment, a dividing wall can be provided in the center of pipe 70 so that the pipe contains two segments. Therefore, one gas can be introduced through one end of the pipe and a different gas can be introduced through the other end of the pipe. In addition, the pipe could also be segmented into any other number of sections, such: as three sections. A pipe containing three sections (e.g. a middle and two ends) can provide one gas to the center of the wafer and a different gas to the edges of the wafer. This method of gas application can aid in minimizing the "photon box effect", which is described in more detail below.

In general, the pipe 70 can also be positioned in a variety of ways to provide the desired temperature control. For instance, in one embodiment, the pipe 70 is arranged parallel to the wafer surface. Moreover, in some embodiments, the gas pipe 70 can also be arranged perpendicular to the direction of the linear heating lamps and/or to the wafer. Typically, the distance of the pipe 70 to the wafer surface is such that the presence of the pipe does not influence the process results. In particular, depending on the size of the process chamber, the distance of the pipe to the wafer surface is generally between about 0.5 cm and about 10 cm.

Further, the pipe 70 is preferably arranged such that at least a portion of the pipe 70 is located directly above the center of rotation of the wafer, e.g., the center of the wafer. However, depending on the rotation velocity (angular velocity) or whether additional pipes are present, the pipe 70 can also be shifted in a direction by a certain distance, such as less than about 5 cm from the center of a wafer having a diameter of about 300 mm. If two pipes are used, the pipes are advantageously arranged symmetrically about the wafer center.

Figure 6:
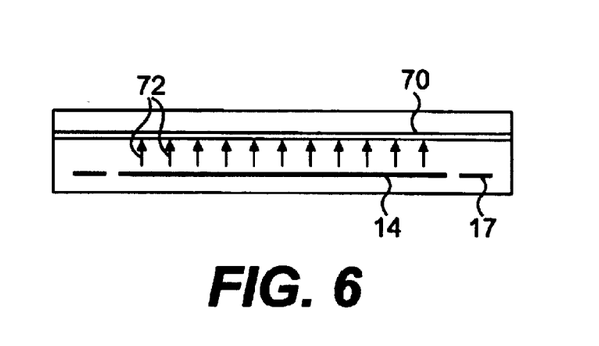
FIG. 6 is a cross-sectional view of an another embodiment of a device used for localized cooling or heating in accordance with the present invention.

Referring to FIG. 6, a pipe 70 also generally includes one or more gas outlets 72 (e.g, holes or nozzles) for ejecting gas onto localized regions of a wafer surface. The supply of gas to such localized regions can provide better control over temperature uniformity of the wafer during the heating cycle. In particular, any of a variety of gases, such as described above, can be applied via gas outlets 72. Further, the gas pipe may eject two or more different gases through different gas outlets. These two gases may be the same or different hot gases, coolant gases, or other process gases.

In general, the diameter of the gas outlets can be the same or can have different diameters. For instance, in one embodiment, the diameter of the outlets corresponding to the edges of wafer 14 is greater than the diameter of the outlets corresponding to the center of wafer 14. By varying the diameter in this manner, the diameter of the outlets can correspond to a disc-shaped object, such as a wafer, in which the total heat capacity of the wafer increases linearly with the radial distance.

Figure 5:
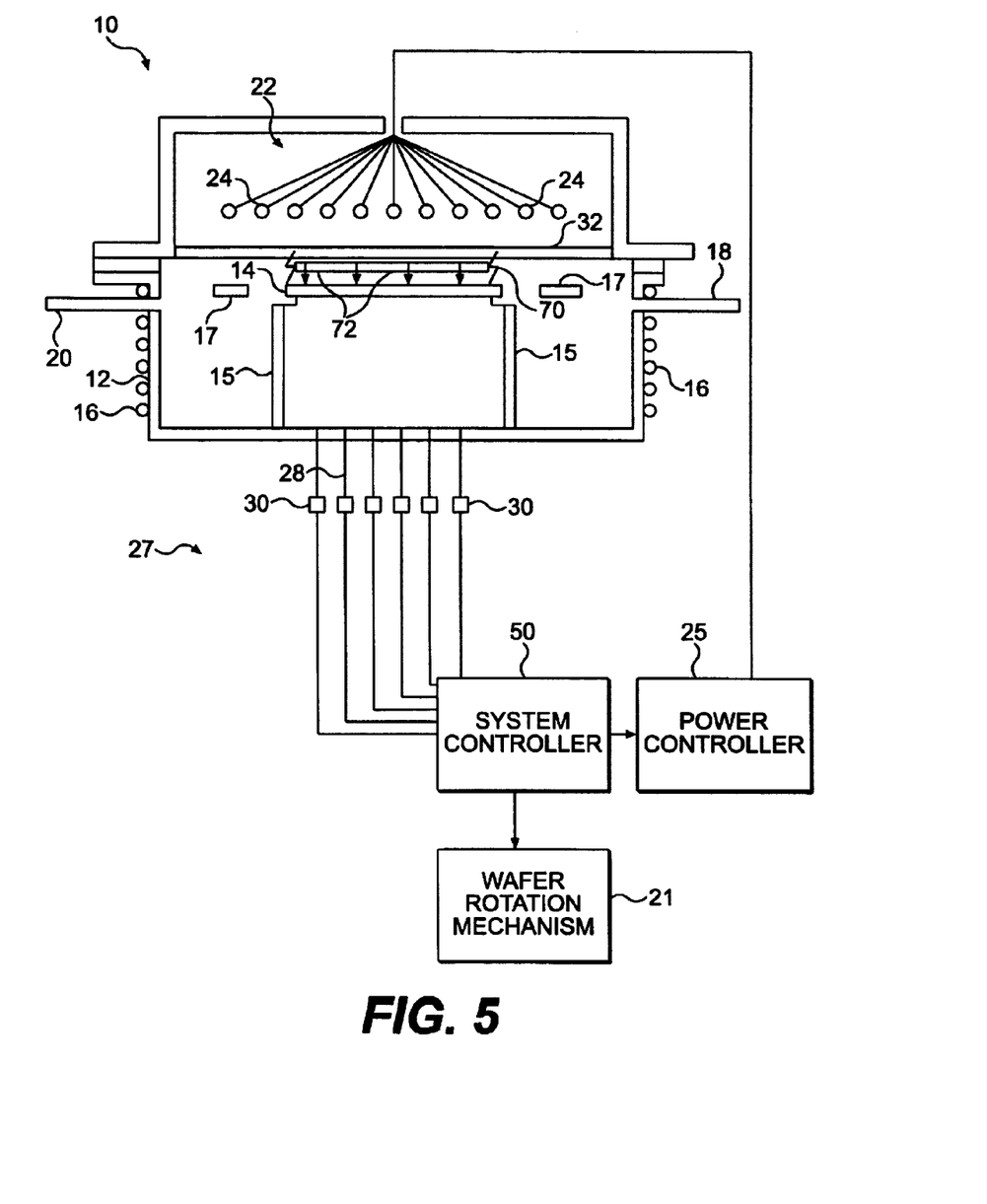
FIG. 5 is a cross-sectional view of another embodiment of an apparatus for heat treating semiconductor wafers in accordance with the present invention.
Figure 7:
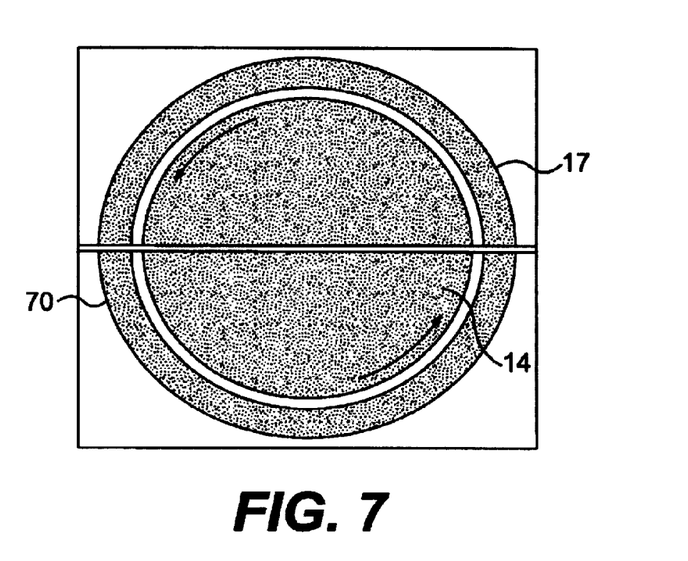
FIG. 7 is a cross-sectional view of the device illustrated in FIG. 6.

Moreover, the outlets can also generally be positioned in a variety of ways to eject gas onto a localized region of wafer 14. For instance, in one embodiment, the outlets 72 can be positioned equidistant to each other so that each outlet corresponds to a certain localized region of wafer 14. In other embodiments, the number of outlets corresponding to the edges of wafer 14 can be greater than the number of outlets corresponding to the center of wafer 14. In addition, the distance between adjacent gas outlets corresponding to the edges of the wafer can also be decreased in comparison to the distance between adjacent gas outlets corresponding to the center of the wafer. Moreover, when surrounded by a slip-free ring (or guard ring) 17, as shown in FIGS. 5 & 7, it may be beneficial to ensure that no gas outlet is positioned directly above the gap between wafer and guard ring when cooling. However, during ramp-up, a gas outlet positioned directly above the gap may be preferred. Further, a pipe of the present invention can also be used to cool or heat the guard ring separately from the wafer.

By appropriately positioning or sizing the gas outlets as described above, the heating and/or cooling of the localized regions of wafer can be effectively controlled. For example, during ramp-up or ramp-down stages of a heat cycle, the edges of the wafer tend to heat or cool faster than the center of the wafer. This tendency is known as the "photon box effect". To compensate for this photon box effect, gas outlets can be positioned or sized to distribute more gas to the edges of the wafer. Thus, for example, during ramp-up, more coolant gas can be utilized to control the temperature of the wafer edges and thereby enhance temperature uniformity.

In general, the gas outlets described above can also be positioned to eject gases at a certain "spread profile" to help control temperature uniformity. As used herein, the term "spread profile" refers generally to the area of a substrate that is contacted by the gas from a particular gas outlet. The spread profile of a gas ejected by a gas outlet may be selected to additionally control the temperature uniformity of a wafer. In particular, the position of the gas outlets is typically chosen such that the spread profile of adjacent gas outlets is slightly overlapping at the surface of the wafer. As such, the whole wafer is cooled and/or heated with sufficient uniformity along the gas outlet chain of the pipe such that no slip lines will occur. This overlap can be controlled in a variety of ways, such as described above, e.g. by controlling the gas flux, varying the position of the outlets along the gas pipe, etc. For instance, in one embodiment, the maximum temperature gradient in the temperature profile across the wafer should be less than about 1° C/cm at temperatures higher than about 700° C.

Figure 9:
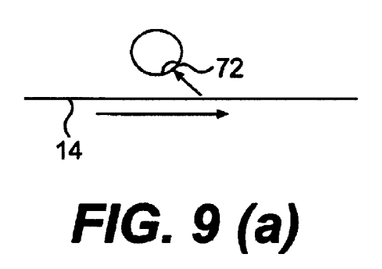
FIGS. 9(a) and 9(b) are illustrations of another embodiment of a device used for localized cooling or heating in accordance with the present invention.

The angle at which the gas outlets eject gas can also be adjusted to control the spread profile of the gas. For example, as shown in FIG. 9, the gas outlets 72 can be angled against the direction of wafer rotation, as indicated by the directional arrows in FIG. 9(a), or can be angled with the direction of wafer rotation, as indicated by the directional arrows of FIG. 9(b). In most embodiments, the gas outlets are positioned at an angle between about 60° to about 120° with respect to the wafer. For instance, as shown in FIG. 6, the gas outlets are positioned at a 90° angle with respect to the wafer. Moreover, in some embodiments, the gas outlets 72 can also be movably mounted on gas pipe 70 so that the angle of gas ejection can be varied during processing.

Figure 8:
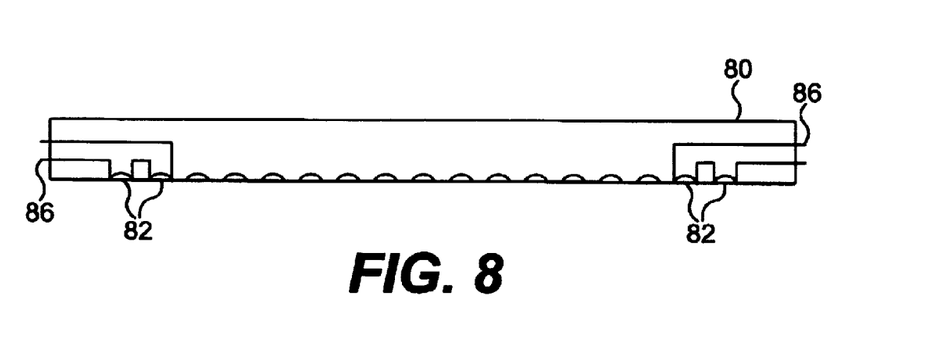
FIG. 8 is a cross-sectional view of an alternative embodiment of a device used for localized cooling or heating in accordance with the present invention.

In accordance with the present invention, more than one gas pipe can be utilized to supply gases to the wafer. For instance, in one embodiment, as shown in FIG. 8, an outer gas pipe 80 can also include an inner gas pipe 86 arranged such that the inner pipe 86 is connected with the gas outlets 82 of the outer gas pipe. Although not required, the inner pipe 86, in this embodiment, is positioned to distribute gases to the edges of a wafer to aid in minimizing the photon box effect. Specifically, a first gas flows through the outer gas pipe 80 to the center regions of a wafer, while a second gas flows through inner gas pipe 86 to the edge regions of the wafer. The first and second gases can be the same or different gases, and can be controlled to provide different rates of cooling and/or heating. For instance, the flux and/or temperature of each gas can be independently controlled to provide better temperature uniformity for each localized region of the wafer.

Figure 10:
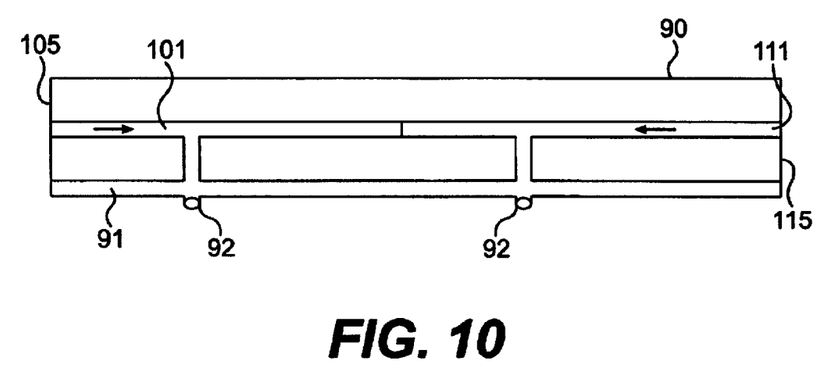
FIG. 10 is a cross-sectional view of an another embodiment of a device used for localized cooling or heating in accordance with the present invention.

Further, in some embodiments, the gas pipe can also include more than one line of gas outlets. For instance, as shown in FIG. 10, gas pipe 90 can include three lines of gas outlets. In particular, a first line 91 of gas outlets 92 is positioned at the bottom of pipe 90 and a second line 101 is positioned above the bottom of pipe 90 such that the second line 101 extends from a first end 105 of the gas pipe to the center. In addition, a third line 111 extends from the middle of the pipe 90 to a second end 115. In some embodiments, the third line 111 is also positioned at approximately the same height as the second line 101. As shown, second line 101 and third line 111 can be positioned such that the outlets of such lines correspond to the outlets 92 of line 91. However, although not depicted, it should be understood that the lines can also be arranged so that the outlets of lines 101 and/or 111 are positioned between or adjacent to outlets 92 of line 91.

The use of multiple lines can generally provide a suitable mechanism for utilizing two or more streams of gas. In particular, a first stream of gas can be ejected onto the wafer by the first line and a second stream can be ejected onto the wafer at an angle by the second and third lines. In some embodiments, the lines can also eject the gas at differing angles as well. In general, such a use of two or more streams can provide a number of advantages. For example, depending on the rotational direction of the wafer, one stream could act as a pre-cooling flux, while the other stream could be used as a post-cooling flux. It should be understood that the lines of gas outlets can generally be arranged in any manner. For example, in one embodiment, the second and third lines can be positioned directly above the first line. Moreover, it should also be understood that any number of lines can be used as well. Further, any of the lines could also be provided with an inner gas pipe, such as illustrated in FIG. 8.

In accordance with the present invention, any process condition or parameter, such as mentioned above, can be automatically controlled by system controller 50. For example, as described in more detail above, light pipes 28 and detectors 30 can be configured to determine the temperature at different localized regions of wafer 14 and communicate such information to controller 50. Thereafter, controller 50 can appropriately adjust any of a variety of process conditions to correct deviations from a desired temperature. For instance, in one embodiment, the temperature of localized regions of the wafer can be controlled by automatically adjusting the flow rate, type, temperature, etc., of the gases utilized, such as described above. In particular, valves 65 and/or heating devices 67 can communicate with controller 50 and be adjusted as necessary.

EXAMPLE

Figure 4:
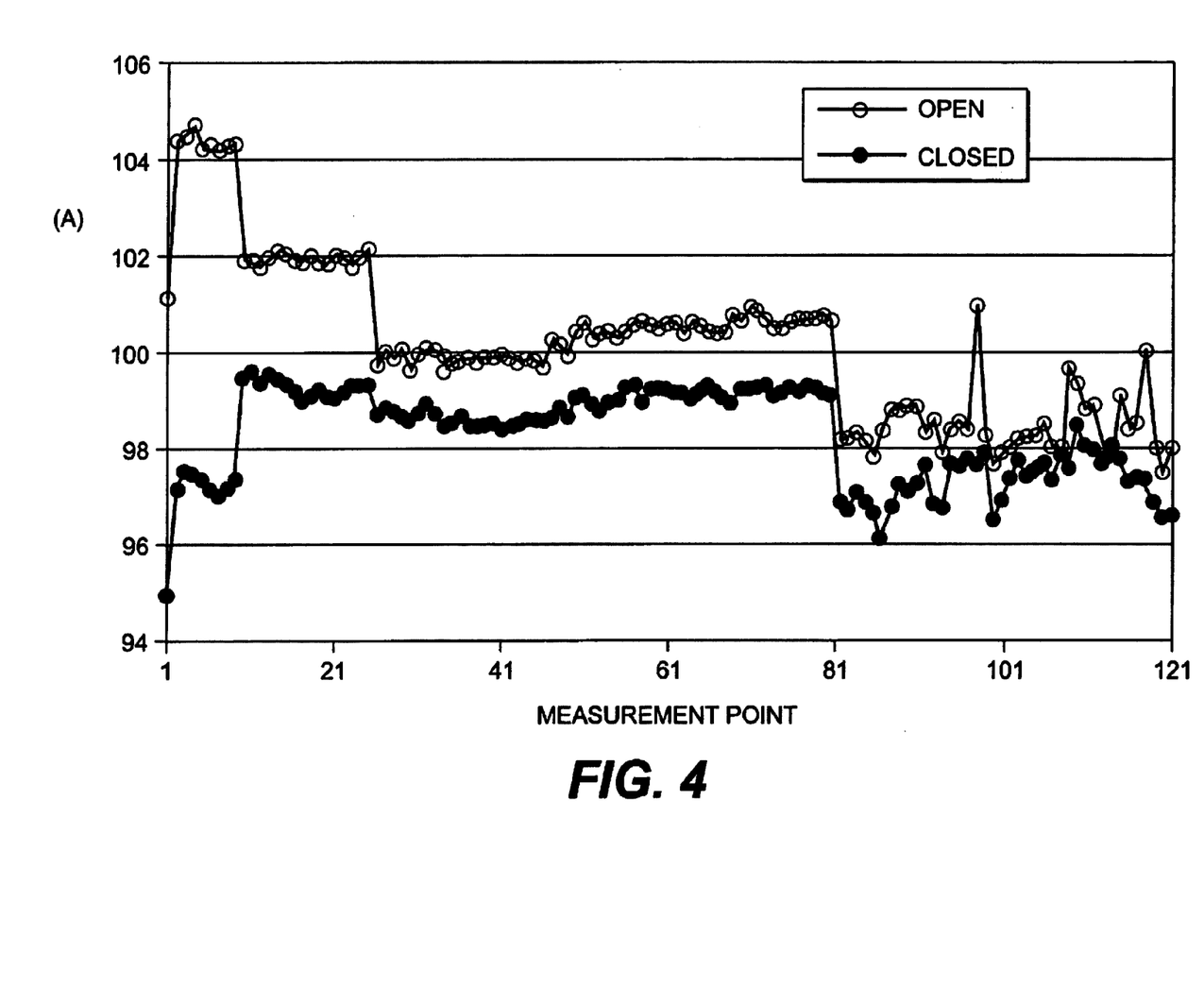
FIG. 4 is a graphical illustration of the Example.

The ability of the apparatus and method of the present invention to minimize temperature deviations during a heat cycle was demonstrated. Referring to FIG. 4, a radial distribution of a 121-point measurement of the oxide thickness of a silicon wafer after an oxidation process of 50 seconds at 1100° C. is illustrated. In this experiment, ring-shaped lamps were used and arranged in about four concentric ring-shaped areas that were individually power controlled. The abscissa shows the 121 points of measurement, representing increasing radial distance with increasing number. Without local cooling (i.e, "Closed"), a clear step profile can be seen when heated with the lamps. This profile corresponds to the spatial arrangement of the heating lamps.

In a second experiment, localized cooling (i.e., "Open") was also applied in conjunction with heating by the same lamps used above. Localized cooling was applied at the bottom surface of the wafer center with only one gas line, ejecting e.g. nitrogen onto the wafer backside. The additional cooling at this localized center region was used to slightly compensate for high lamp radiation in the center. As shown by the reduced "peaks" in FIG. 4, localized cooling improved the radial uniformity of the oxide thickness. This was due to an improvement of radial temperature uniformity across the wafer.

Accordingly, as a result of the apparatus and method of the present invention, localized regions of a substrate, such as a semiconductor wafer, can be adequately controlled to enhance temperature uniformity throughout the heating cycle. For example, the present invention can compensate for the "photon box effect" during temperature ramp-up and ramp-down stages. Moreover, the use of higher powered lamps, which may allow heating to higher temperatures without destruction of the substrate, can also be attained as a result of the present invention. This is possibly due to the ability of the present invention to cool the edges of the wafer to a uniform temperature during heating.

Additionally, other advantages of the present invention include selective cooling or heating of the wafer, localized temperature modifications on wafer to improve controllability, increased throughput by improved cooling during wafer cool down. Moreover, the use of different gases above and below the wafer can reduce errors arising from use of inert gas during calibration and a reactive gas during processing.

Besides the applications described above, other applications of the present invention are also possible. For example, in one embodiment, process gases can also be supplied to the system through gas nozzles. For instance, the gas nozzles could also be used in copper reflow processes where the calibration of the system is done in an inert ambient (e.g., nitrogen, argon, etc.) and the processing is then done in a hydrogen ambient. Such a process can produce temperature deviations in calibration due to the usage of different gases, which have different thermal conductivities. A system of the present invention can help to maintain wafer temperature uniformity by directly blowing an inert gas against the bottom surface of the wafer, while simultaneously processing the top surface of the wafer with hydrogen gas. By locating the nozzles of the gas outlets below the plane of the wafer, as shown in FIG. 1, the tendency of the gases to mix can be reduced. As a result, the error arising from heat conduction from the wafer to the reflector plate would be eliminated.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for heat treating a semiconductor wafer, said method comprising the steps of:
   placing a semiconductor wafer in a thermal processing chamber that is in communication with a plurality of lamps, said semiconductor wafer defining a plurality of localized regions along a radial axis;
   adjusting the temperature of said semiconductor wafer to a predetermined temperature according to a predetermined heat cycle, said predetermined heat cycle including a heating stage in which said semiconductor wafer is heated by said plurality of lamps;
   during at least one stage of said predetermined heat cycle, providing a gas to directly and selectively control the temperature of at least one of said localized regions of said semiconductor wafer to minimize temperature deviation of said at least one localized region from said predetermined temperature.

2. A method as defined in claim 1, further comprising the steps of:
   monitoring the temperature of said at least one localized region with a temperature sensing device, said temperature sensing device being in communication with a controller; and
   based on information received by said controller from said temperature sensing device, controlling the temperature of said at least one localized region according to said predetermined heat cycle.

3. A method as defined in claim 1, further comprising the step of controlling the temperature of said gas.

4. A method as defined in claim 1, further comprising the step of controlling the flow rate of said gas.

5. A method as defined in claim 1, wherein said temperature deviation is less than about 100° C.

6. A method as defined in claim 1, wherein said temperature deviation is less than about 25° C.

7. A method as defined in claim 1, wherein said at least one localized region comprises less than about 50% of a cross-section of said semiconductor wafer.

8. A method as defined in claim 1, wherein said at least one localized region comprises less than about 25% of a cross-section of said semiconductor wafer.

9. A method as defined in claim 1, wherein said at least one localized region comprises less than about 15% of a cross-section of said semiconductor wafer.

10. A method as defined in claim 1, wherein said temperature of said at least one localized region is decreased during said heating stage of said predetermined heat cycle.

11. A method as defined in claim 1, wherein said predetermined heat cycle further comprises a cooling stage.

12. A method as defined in claim 11, wherein said temperature of said at least one localized region is increased during said cooling stage of said predetermined heat cycle.

13. A method as defined in claim 1, wherein said gas used to selectively control the temperature of at least one of said localized regions is supplied by a device located below said semiconductor wafer.

14. A method as defined in claim 1, wherein said gas used to selectively control the temperature of at least one of said localized regions is supplied by a device located above said semiconductor wafer.

15. A method as defined in claim 14, wherein said device comprises a gas pipe having a plurality of gas outlets.

16. A method for heat treating a semiconductor wafer, said method comprising the steps of:
   placing a semiconductor wafer in a thermal processing chamber, said semiconductor wafer defining a plurality of localized regions along a radial axis;
   adjusting the temperature of said semiconductor wafer using a plurality of lamps to a predetermined temperature according to a predetermined heat cycle, said predetermined heat cycle including a heat stage;
   during at least one stage of predetermined heat cycle, providing a gas to directly and selectively control the temperature of at least one of said localized regions of said semiconductor wafer to minimize temperature deviation of said at least one localized region from said predetermined temperature, said gas being supplied by a reflective device located below said semiconductor wafer.

17. A method as defined in claim 16, wherein a plurality of gas outlets extend through said reflective device.

18. A method for heat treating a semiconductor wafer, said method comprising the steps of:
   placing a semiconductor wafer in a thermal processing chamber, said semiconductor wafer defining a plurality of localized regions along a radial axis;
   adjusting the temperature of said semiconductor wafer using a plurality of lamps to a predetermined temperature according to a predetermined heat cycle, said predetermined heat cycle including a heat stage;
   during at least one stage of predetermined heat cycle, providing a gas to directly and selectively control the temperature of at least one of said localized regions of said semiconductor wafer to minimize temperature deviation of said at least one localized region from said predetermined temperature, said gas being supplied by a gas pipe located above said semiconductor wafer, wherein said gas pipe has a plurality of gas outlets.

19. A method for heat treating a semiconductor wafer, said method comprising the steps of:
   placing a semiconductor wafer in a thermal processing chamber that is in communication with a plurality of lamps, said semiconductor wafer defining a plurality of localized regions along a radial axis;
   adjusting the temperature of said semiconductor wafer to a predetermined temperature according to a predetermined heat cycle, said predetermined heat cycle including a heating stage in which said semiconductor wafer is heated by said plurality of lamps;
   during at least one stage of said predetermined heat cycle, providing a gas to directly and selectively control the temperature of at least one of said localized regions of said semiconductor wafer to minimize temperature deviation of said at least one localized region from said predetermined temperature, wherein said gas used to selectively control the temperature of at least one of said localized regions is supplied by a device located below said semiconductor wafer, wherein said device is a reflective device through which a plurality of gas outlets extend.

20. A method for heat treating a semiconductor wafer, said method comprising the steps of:
   placing a semiconductor wafer in a thermal processing chamber that is in communication with a plurality of lamps, said semiconductor waer defining a plurality of localized regions along a radial axis;
   adjusting the temperature of said semiconductor wafer to a predetermined temperature according to a predetermined heat cycle, said predetermined heat cycle including a heating stage in which said semiconductor wafer is heated by said plurality of lamps and a cooling stage;
   during said cooling stage, providing a gas to directly and selectively control the temperature of at least one of said localized regions of said semiconductor wafer to minimize temperature deviation of said at least one localized region from said predetermined temperature.

21. A method as defined in claim 20, further comprising the steps of:
   monitoring the temperature of said at least one localized region with a temperature sensing device, said temperature sensing device being in communication with a controller; and
   based on information received by said controller from said temperature sensing device, controlling the temperature of said at least one localized region according to said predetermined heat cycle.

22. A method as defined in claim 20, further comprising the step of controlling the temperature of said gas.

23. A method as defined in claim 20, further comprising the step of controlling the the flow rate of said gas.

24. A method as defined in claim 20, wherein said temperature deviation is less than about 100° C.

25. A method as defined in claim 20, wherein said temperature deviation is less than about 25° C.

26. A method as defined in claim 20, wherein said at least one localized region comprises less than about 50% of a cross-section of said semiconductor wafer.

27. A method as defined in claim 20, wherein said at least one localized region comprises less than about 25% of a cross-section of said semiconductor wafer.

28. A method as defined in claim 20, wherein said at least one localized region comprises less than about 15% of a cross-section of said semiconductor wafer.

29. A method as defined in claim 28, wherein said temperature of said at least one localized region is increased during said cooling stage.

30. A method as defined in claim 28, wherein said temperature of said at least one localized region is decreased during said cooling stage.

31. A method as defined in claim 20, wherein said gas used to selectively control the temperature of at least one of said localized regions is supplied by a device located below said semiconductor wafer.

32. A method as defined in claim 20, wherein said gas used to selectively control the temperature of at least one of said localized regions is supplied by a device located above said semiconductor wafer.

33. A method as defined in claim 32, wherein said device comprises a gas pipe having a plurality of gas outlets.

* * * * *